US009059695B2

(12) United States Patent
Oh

(10) Patent No.: US 9,059,695 B2
(45) Date of Patent: Jun. 16, 2015

(54) METHODS AND SYSTEMS FOR REDUCING SUPPLY AND TERMINATION NOISE

(71) Applicant: Rambus Inc., Sunnyvale, CA (US)

(72) Inventor: Kyung Suk Oh, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/192,550

(22) Filed: Feb. 27, 2014

(65) Prior Publication Data
US 2014/0285232 A1  Sep. 25, 2014

Related U.S. Application Data

(63) Continuation of application No. 13/498,874, filed as application No. PCT/US2010/047466 on Sep. 1, 2010, now Pat. No. 8,692,574.

(60) Provisional application No. 61/247,764, filed on Oct. 1, 2009.

(51) Int. Cl.
H03K 19/00 (2006.01)
G11C 5/06 (2006.01)
G11C 7/02 (2006.01)
G11C 7/10 (2006.01)
G11C 29/02 (2006.01)
G11C 29/50 (2006.01)

(52) U.S. Cl.
CPC ............ *H03K 19/0005* (2013.01); *G11C 5/063* (2013.01); *G11C 7/02* (2013.01); *G11C 7/1051* (2013.01); *G11C 7/1057* (2013.01); *G11C 7/1078* (2013.01); *G11C 7/1084* (2013.01); *G11C 29/02* (2013.01); *G11C 29/025* (2013.01); *G11C 29/028* (2013.01); *G11C 29/50008* (2013.01); *G11C 2207/2254* (2013.01)

(58) Field of Classification Search
None
See application file for complete search history.

(56) References Cited

U.S. PATENT DOCUMENTS

| 5,311,081 | A |   | 5/1994 | Donaldson et al. |       |
|-----------|---|---|--------|------------------|-------|
| 5,604,450 | A | * | 2/1997 | Borkar et al.    | 326/82 |
| 5,608,345 | A |   | 3/1997 | Macbeth et al.   |       |
| 5,793,223 | A | * | 8/1998 | Frankeny         | 326/30 |
| 6,037,803 | A | * | 3/2000 | Klein            | 326/86 |
| 6,078,978 | A |   | 6/2000 | Suh              |       |

(Continued)

FOREIGN PATENT DOCUMENTS

KR   10-2002-0002883   1/2002

OTHER PUBLICATIONS

International Search Report and Written Opinion dated May 2, 2011 re International Application No. PCT/US2010/047466. 8 pages.

(Continued)

*Primary Examiner* — Jason M Crawford
*Assistant Examiner* — Nelson Correa
(74) *Attorney, Agent, or Firm* — Silicon Edge Law Group LLP; Arthur J. Behiel

(57) ABSTRACT

Described is a communication system in a first integrated circuit (IC) communicates with a second IC via single-ended communication channels. A bidirectional reference channel extends between the first and second ICs and is terminated on both ends. The termination impedances at each end of the reference channel support different modes for communicating signals in different directions. The termination impedances for the reference channel can be optimized for each signaling direction.

20 Claims, 6 Drawing Sheets

(56) References Cited

U.S. PATENT DOCUMENTS

| | | | |
|---|---|---|---|
| 6,653,858 B2 | 11/2003 | Meier et al. | |
| 6,674,338 B2 | 1/2004 | Novak | |
| 6,677,637 B2 | 1/2004 | Bernstein et al. | |
| 6,677,814 B2 | 1/2004 | Low et al. | |
| 6,686,809 B2 | 2/2004 | Nystrom et al. | |
| 6,836,142 B2 | 12/2004 | Lesea et al. | |
| 6,873,035 B2 | 3/2005 | Watanabe et al. | |
| 6,873,228 B1 | 3/2005 | Barratt | |
| 6,967,500 B1 | 11/2005 | Lin et al. | |
| 6,980,020 B2 * | 12/2005 | Best et al. | 326/30 |
| 7,058,131 B2 * | 6/2006 | Dreps et al. | 375/257 |
| 7,741,855 B2 | 6/2010 | Jao | |
| 7,928,757 B2 * | 4/2011 | Nguyen et al. | 326/30 |
| 8,041,865 B2 | 10/2011 | Bruennert et al. | |
| 8,319,519 B2 * | 11/2012 | Lee | 326/30 |
| 8,384,423 B2 * | 2/2013 | Nguyen et al. | 326/30 |
| 8,692,574 B2 * | 4/2014 | Oh | 326/30 |
| 2005/0154547 A1 | 7/2005 | Nguyen et al. | |
| 2005/0281114 A1 | 12/2005 | Choi et al. | |
| 2005/0283671 A1 | 12/2005 | Stave | |
| 2006/0197549 A1 | 9/2006 | Nygren | |
| 2007/0040605 A1 | 2/2007 | Fan et al. | |
| 2007/0073506 A1 | 3/2007 | Boskovic | |
| 2007/0127169 A1 | 6/2007 | Nguyen | |
| 2008/0030221 A1 | 2/2008 | Lee et al. | |
| 2008/0052571 A1 | 2/2008 | Lee et al. | |
| 2008/0272800 A1 | 11/2008 | Haig et al. | |
| 2013/0307607 A1 * | 11/2013 | Oh | 327/384 |

OTHER PUBLICATIONS

International Search Report and Written Opinion dated Nov. 30, 2006 re International Application No. PCT/US2006/045967. 11 pages.

Kim et al., "Design of an Interconnect Architecture and Signaling Technology for Parallelism in Communication," IEEE transactions on Very Large Scale Integration (VLSI) Systems, vol. 15, No. 8, Aug. 2007. 14 pages.

Larsson, Patrik, "Resonance and Dampling in CMOS Circuits with On-Chip Decoupling Capabilities," IEEE Transactions on Circuits and Systems-I: Fundamental Theory and Applications, vol. 45, No. 8, Aug. 1998. 10 pages.

PCT International Preliminary Report on Patentability (Chapter I) dated Apr. 12, 2012 re International Application No. PCT/US2010/047466. 5 pages.

Zhao et al., "Power Supply Noise Aware Floorplanning and Decoupling Capacitance Placement," Proceedings of the 15th International Conference on VLSI Design, IEEE 2002. 7 pages.

\* cited by examiner

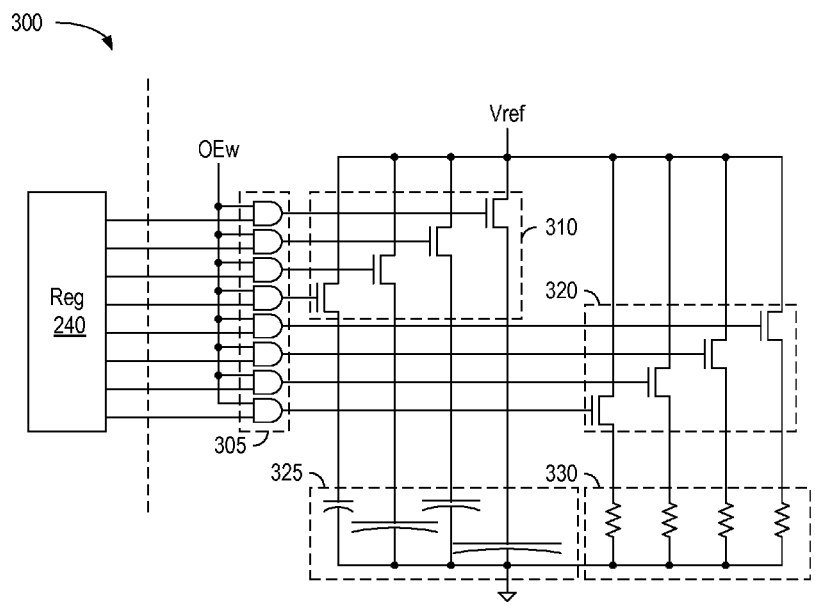
Fig. 3A
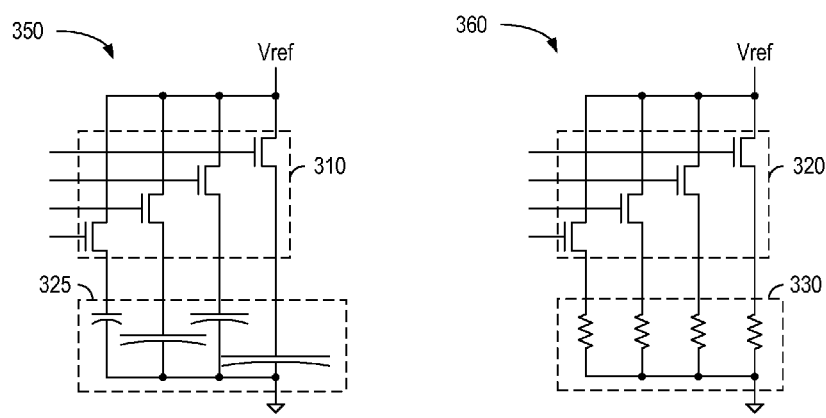
Fig. 3B
Fig. 3C

METHODS AND SYSTEMS FOR REDUCING SUPPLY AND TERMINATION NOISE

FIELD

The invention relates to the creation and delivery of reference signals for interpretation of signals conveyed within and between integrated circuits.

BACKGROUND

Transmitters and receivers in typical high-speed digital communication systems communicate data as a series of symbols, each symbol representing a different logical value for a time period called a "unit interval," or "UI." For a 2-PAM signal, each symbol represents a single binary "bit" that represents either a logic one as a relatively high voltage or a logic zero as a relatively low voltage. Other encoding schemes also exist, including for example, schemes that transmit more than two possible logic values in any given UI, that encode logic values as high-to-low or low-to-high transitions, or that otherwise generate a signal based upon one or more bit values. A transmitter can thus convey data as bit patterns expressed as a voltage signal that transitions between relatively different voltage levels. A receiver can recover the bit patterns, and therefore the original data, by comparing the voltage signal against a suitable reference voltage to distinguish voltage levels during each UI.

Transmitters draw current from a power supply to express voltage levels and to transition between them. However, power supplies are imperfect. For example, the lines and pads used to convey supply current exhibit parasitic resistive, inductive, and capacitive impedances. Unfortunately, this impedance and the data-dependent supply current together cause the supply voltage to fluctuate. The reference voltage employed by the receiver can also be affected. The resulting supply and reference noise effect signal integrity and therefore limit performance.

Many systems support higher data rates by transmitting multiple data streams in parallel. For example, eight data channels may transmit eight data streams in parallel to communicate eight bits per UI. Unfortunately, simultaneously transmitting and recovering multiple bits exacerbates the problems of data-dependent supply noise because supply current can vary dramatically between UIs. The resulting problem is referred to by those of skill in the art as simultaneous switching noise, or SSN. Such instability can introduce significant noise in supply and reference voltages, and thus adversely impact performance.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIG. 3A depicts a termination element 300 that can be used in some embodiments to provide for selective impedances; for example, one or more of termination elements Z1, Z2, Z3, and Z4 of FIGS. 1 and 2 could be implemented using termination element 300.

FIG. 3B depicts another embodiment of a termination element 350 that can be used to provide selective impedances.

FIG. 3C depicts yet another embodiment of a termination element 360 that can be used to provide selective impedances.

DETAILED DESCRIPTION

The following description details systems and methods that mitigate the problems associated with SSN using bidirectional reference-termination schemes. These systems include a reference channel to convey reference signals against which to interpret data signals on associated bidirectional or unidirectional data channels. The reference signals are directional in that termination impedances associated with the reference channel are dynamically altered depending on the direction of data transmission along the associated data channels. The described systems and methods may be used to permit adjustment of a reference at a receiver (e.g., a reference voltage) in a manner that tracks supply noise switching occurring at a remote transmitter, and thus mitigates some of the SSN issues. The described systems and methods can also be used to mitigate channel mismatch between the two directions of bidirectional channels. Furthermore, these schemes can be used to communicate between integrated circuits with different supply voltages, advantageously eliminating the need of two reference lines in some systems.

Figure 1:
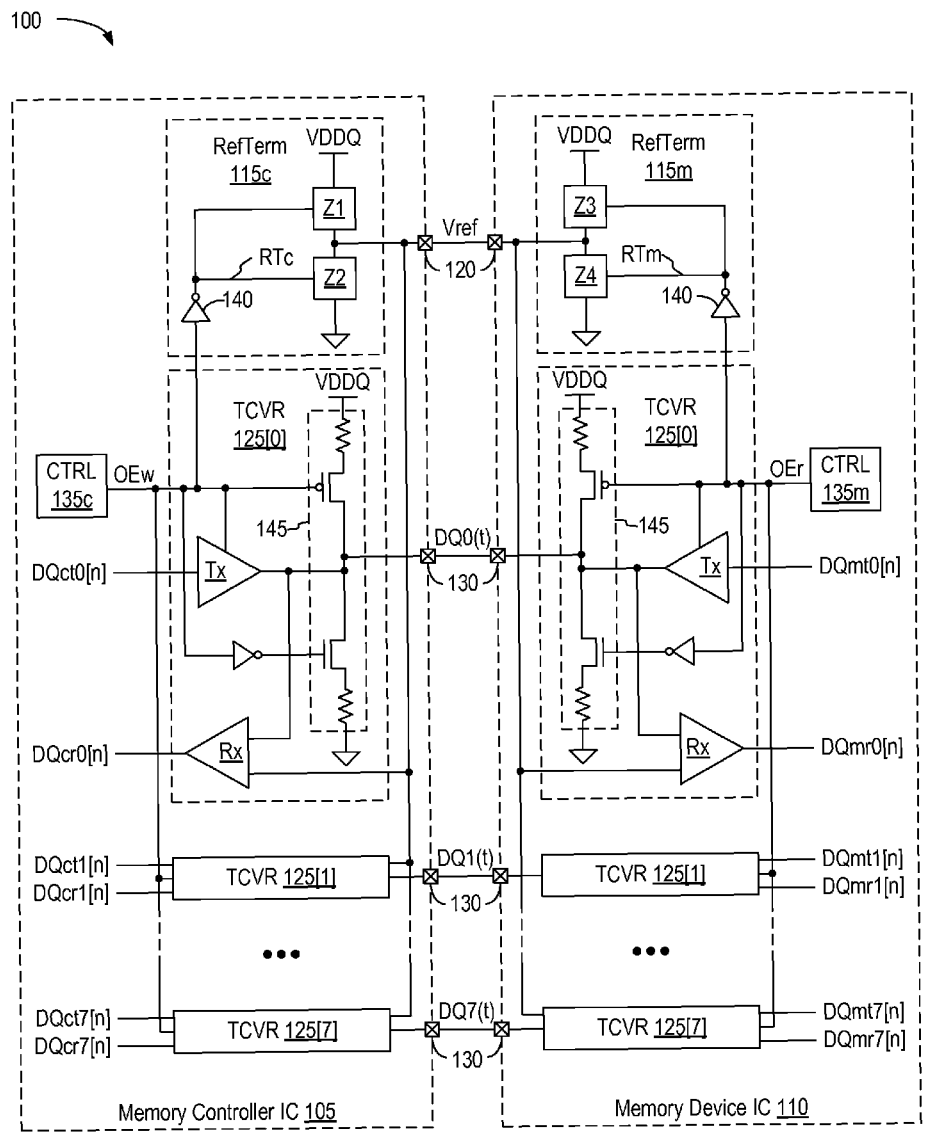
FIG. 1 depicts a communication system 100 in which a first integrated circuit (IC) 105 communicates with a second IC 110 via eight bidirectional communication channels DQ[7:0](t).

FIG. 1 depicts a communication system 100 in which a first integrated circuit (IC) 105 communicates with a second IC 110 via eight bidirectional, single-ended communication channels DQ0(t) to DQ7(t), or DQ[7:0](t). In accordance with this embodiment, ICs 105 and 110 support a bidirectional reference channel Vref that is selectively terminated on both ends. (As with other designations herein, the labels DQ[7:0](t) and Vref refer both to the nodes and their corresponding signals; whether a given designation refers to a signal or a conductor will be clear from the context.)

The termination impedances at each end of the reference channel Vref support at least two modes. In one mode the termination impedances are optimized for communicating signals from IC 105 to IC 110, and in another for communicating signals in the opposite direction. Tailoring the termination impedance of the reference channel causes reference voltage Vref to more closely track noise on related data lines, and consequently allows signal receivers to better discriminate received signals. In other cases, tailoring the termination impedance can compensate for any mismatches between the two directions.

In this example IC 105 and IC 110 are a memory controller and a memory device, respectively, and the information channels DQ[7:0](t) convey data signals. The depicted interface circuitry is more broadly applicable, however, so memory-specific structures are omitted. The depicted input/output circuitry is identical for both ICs in this example, with like-labeled elements being the same or similar. Much of the following discussion will focus on IC 105 for brevity.

Some elements and signals common to both the controller IC 105 and the memory IC 110 have the same numerical designation but end in either a "c," for "controller," or an "m," for "memory." Following this convention, controller IC 105 includes a reference-termination block 115c coupled to reference channel Vref via a reference pad 120, eight transceivers 125 [7:0] to transmit and receive information signals on respective information pads 130, and control circuitry 135c that controls the direction of signal flow for each transceiver 125 and the termination mode for reference-termination block 115c. Reference termination block 115c includes two reference termination elements Z1 and Z2, each of which is connected between reference pad 120 and one of supply nodes VDDQ and ground. Termination elements Z1 and Z2 each include a control node coupled to a common control node RTc via an inverter 140. Signal RTc is a logic signal that, when de-asserted, causes both termination elements Z1 and Z2 to exhibit a high impedance, and when asserted causes both termination elements to exhibit a lower termination impedance. The termination elements can be resistive, capacitive, or a combination of the two. Termination networks that employ capacitors may be referred to as "decoupling networks," and termination networks in accordance with capacitive embodiments may be alternatively referred to as "decoupling networks."

Transceiver 125[0] includes a transmitter Tx, a receiver Rx, and termination circuitry 145 that together support a signaling scheme commonly referred to as Stub Series Terminated Logic, or SSTL. In a transmit mode, transmitter Tx amplifies a discrete-time signal DQct0[n] and presents the resulting continuous-time signals DQ0(t) on respective information pad 130. In a receive mode, receiver Rx receives an incoming continuous-time signal on the same channel DQ0(t) and recovers a discrete-time signal DQcr0(n). The remaining transceivers TCVR[7:1] are identical.

System 100 is a memory system in this example, so transmitting data signals DQ0(t) to DQ7(t), or DQ[7:0](t), from left to right is referred to as a "write," and transmitting data signals in the opposite direction a "read." Write operations can therefore be considered to occupy a "transmit time" from the perspective of controller IC 105, and a "receive time" from the perspective of memory IC 110. These roles reverse for read operations. Controller IC 105 controls memory device IC 110 by way of a request channel (not shown). As is well known to those of skill in the art, the information signals conveyed over a request channel include e.g. command and address signals.

During write operations, control circuitry 135c on IC 105 asserts output-enable-write signal OEw and control circuitry 135m on IC 110 de-asserts output-enable-read signal OEr. On the controller side, the asserted signals OEw enables transmitter Tx, disables termination circuitry 145, and de-asserts signal RTc to disable both termination elements Z1 and Z2 (terminations are said to be "disabled" when they are effectively disconnected to present a high impedance to the terminated node). On the memory side, the de-asserted signal OEr disables transmitter Tx, enables termination circuitry 145, and asserts signal RTm to enable both termination elements Z3 and Z4 (terminations are said to be "enabled" when they present termination impedance to the terminated node). With system 100 thus configured, each data channel DQ[7:0](t) and reference channel Vref exhibits a high impedance to supply nodes VDDQ and ground at the controller side of the channels and relatively lower termination impedances to supply nodes VDDQ and ground at the memory-device side. Supply nodes VDDQ and ground carry other reference values in other embodiments (e.g., positive or negative voltages different that the supply voltage of an IC or zero volts). In some embodiments, each of these nodes can carry a DC value, where DC means the respective voltage signal is maintained relatively constant during transmission and reception of data signals.

During read operations, control circuitry 135c on IC 105 de-asserts output-enable-write signal OEw and control circuitry 135m on IC 110 asserts output-enable-read signal OEr. On the controller side, the de-asserted signals OEw disables transmitter Tx, enables termination circuitry 145, and asserts signal RTc to enable both termination elements Z1 and Z2. On the memory side, the asserted signals OEr enables transmitter Tx, disables termination circuitry 145, and de-asserts signal RTm to disable both termination elements Z3 and Z4. With system 100 thus configured, each data channel DQ[7:0](t) and reference channel Vref exhibits a high impedance to supply nodes VDDQ and ground at the memory-device side and relatively lower termination impedances to supply nodes VDDQ and ground at the controller side.

System 100 alters the reference-termination impedance based on the direction of data transmission by selectively enabling and disabling termination elements. In practice, however, the direction-based alterations in termination impedance can be less extreme. For example, the system can increase the value of a reference-termination impedance without entirely disconnecting the terminated node. In general, the values of the reference-termination elements can be adjusted for each signal direction to afford the best signaling performance. In the example of FIG. 1, all four values of termination elements Z1-Z4 can be optimized to produce e.g. the highest signal margins or the lowest error rate for both signaling directions.

Figure 2:
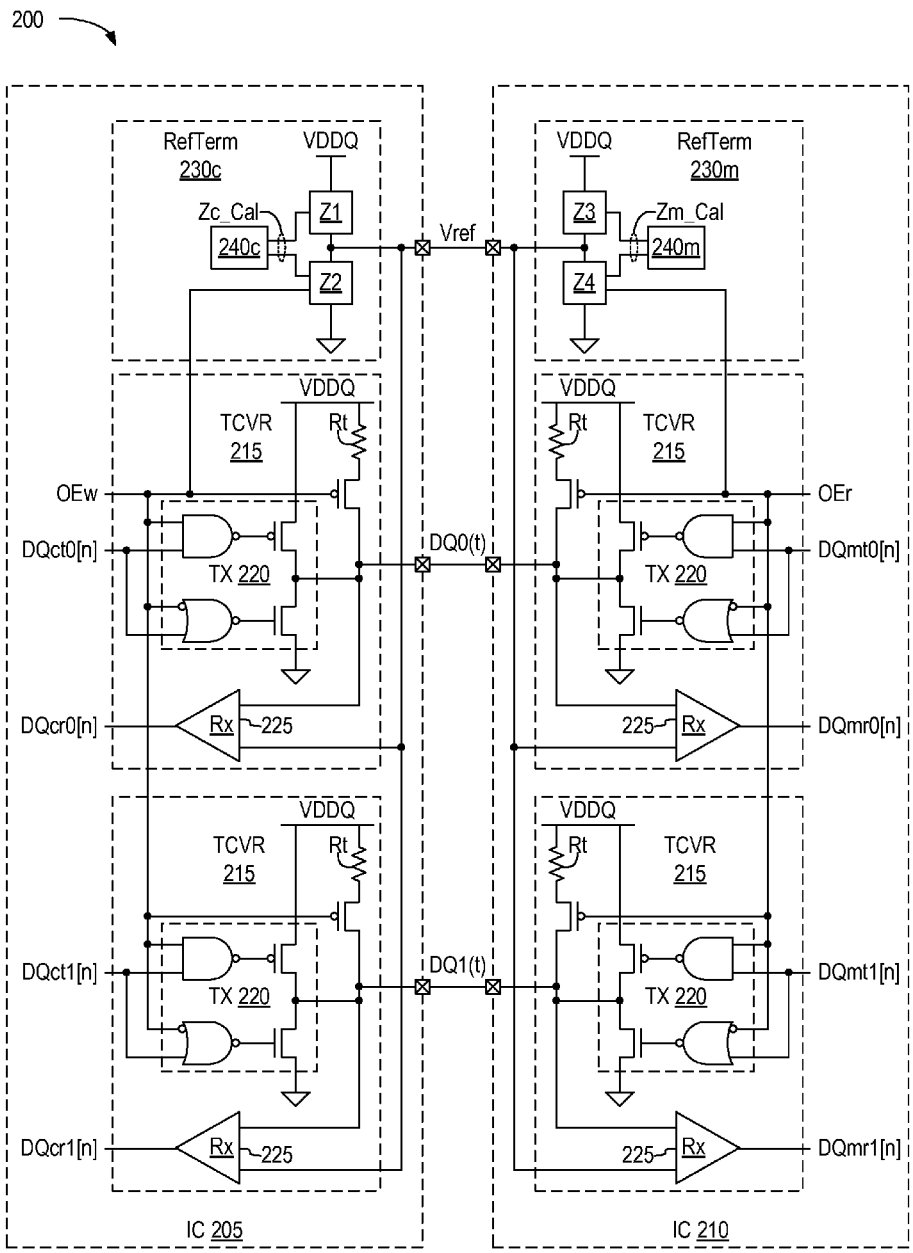
FIG. 2 depicts a system 200 in accordance with another embodiment in which respective ICs 205 and 210 communicate using e.g. a pseudo-open-drain logic (PODL) scheme.

FIG. 2 depicts a system 200 in accordance with another embodiment in which respective ICs 205 and 210 communicate using e.g. a pseudo-open-drain logic (PODL) scheme. System 200 is operationally similar to system 100 of FIG. 1, so the following discussion focuses on the differences. System 200 only shows two channels DQ0(t) and DQ1(t), though a typical implementation would include more.

ICs 205 and 210 each include two transceivers 215, each of which in turn includes a transmitter 220, a receiver 225, and a pull-up termination resistor Rt with associated control transistor. Termination resistors Rt associated with data channels DQ0(t) and DQ1(t) are provided to match the characteristic impedance of the channel to the input impedances of respective receivers 225. Additional structures can be included in other embodiments to match the output impedances of transmitters 220. Control systems (not shown) may be included to calibrate the impedances of termination elements Rt for improved impedance matching. Suitable methods and circuits for calibrating termination elements are well known to those of skill in the art. A detailed discussion of such methods and circuits is therefore omitted for brevity.

Each IC 205 and 210 additionally includes a respective termination block 230c/230m. Each of two reference termination elements Z1 and Z2 includes a calibration port coupled to a register 240c to receive a pair of calibration signal Zc_Cal that determine the impedances of elements Z1 and Z2. Reference termination elements Z3 and Z4 on IC 210 likewise include calibration ports coupled to a register 240m to receive a calibration signal Zm_Cal. Calibration signals Zc_Cal and Zm_Cal are selected during a calibration process to maximize the signal margins for receivers 225. Termination elements Z1 and Z3 are always enabled in this example; in other embodiments all the termination elements can be disabled to conserve power when the data channels are quiescent.

Assuming, as in the example of FIG. 1, that IC 205 is a memory controller and IC 210 a memory device, the following discussion refers to data transmissions from left to right as "write operations" and from right to left as "read operations." For writes, IC 205 asserts output-enable signal OEw and IC 110 de-asserts output-enable signal OEr. On IC 205, the asserted signal OEw enables transmitters 220, disconnects termination resistors Rt, and enables termination element Z2. On IC 210, the de-asserted signal OEr disables transmitters 220, connects termination resistors Rt to the signal channels, and disables termination element Z4. The three enabled termination elements Z1, Z2, and Z3 thus develop reference voltage Vref on the reference channel.

For reads, IC 205 de-asserts output-enable signal OEw and IC 110 asserts output-enable signal OEr. The roles of the transceivers 215 on the respective ICs are reversed, and termination blocks 230 are reconfigured to support the changed signal direction. Namely, termination element Z2 is disabled and Z4 enabled so that elements Z1, Z3 and Z4 develop reference voltage Vref on the reference channel. As in the embodiment of FIG. 1, the direction-based alterations in termination impedance for system 200 need not entirely disable termination elements. Rather, the values of the four termination elements can be optimized for each signal direction.

The embodiment of FIG. 2 is easily modified to support other signaling schemes. For example, systems that include well-known "open-drain" transmitter configurations can use a termination scheme similar the one illustrated in FIG. 2. In one such open-drain embodiment the impedances of termination elements Z2/Z3 are set relatively low and Z1/Z4 high for writes, and the impedances of termination elements Z2/Z3 are set relatively high and Z1/Z4 low for reads. In still other embodiments one or more of the four termination elements depicted in FIGS. 1 and 2 can be omitted. In each case the objective is to provide different termination impedances for the reference channel depending upon the direction of data flow, with each termination impedance tailored to enhance some performance metric of interest. Moreover, communicating ICs that use different supply or reference voltages can use dynamic termination networks like those detailed above to generate reference-voltage signals optimized for the direction of data flow.

FIG. 3A depicts a termination element 300 that can be used for termination element Z2 of FIGS. 1 and 2. Termination elements Z1, Z3, and Z4 can be implemented similarly. When output-enable signal OEw is de-asserted, a collection of AND gates 305 grounds the gates of parallel transistors 310 and 320 to decouple terminal Vref from ground. When asserted, signal OEw allows calibration register 240 to control transistors 310 and 320. Transistors 310 then selectively couple one or more differently sized capacitors 325 between node Vref and ground, while transistors 320 selectively couple one or more differently sized resistors 330 in parallel with the capacitors. By controlling transistors 310 and 320, register 240 can trim the impedance between terminals Vref and ground. The values of capacitors 325 and resistors 330 can be e.g. binary coded to offer a broad range of impedances for a relatively low number of control lines. The numbers and values of the capacitors and transistors can be selected to offer a desired range and granularity of adjustment. Calibration register 240 can be implemented using a number of storage technologies, and the output from one register can be shared between impedance elements. Other methods of controlling impedances are well known to those of skill in the art.

FIGS. 3B and 3C respectively depict termination elements 350 and 360 that can be used to form dynamic termination networks in accordance with other embodiments. Element 350 lacks resistive paths between the supply and reference nodes, and would be used to form decoupling networks. Element 360, in contrast, lacks discrete capacitors between the supply nodes, and thus provides little decoupling. As used herein, a "reference termination element" can be any structure (e.g., circuit) used to permit impedance adjustments of a reference channel at the transmitting and receiving sides.

Figure 4A:
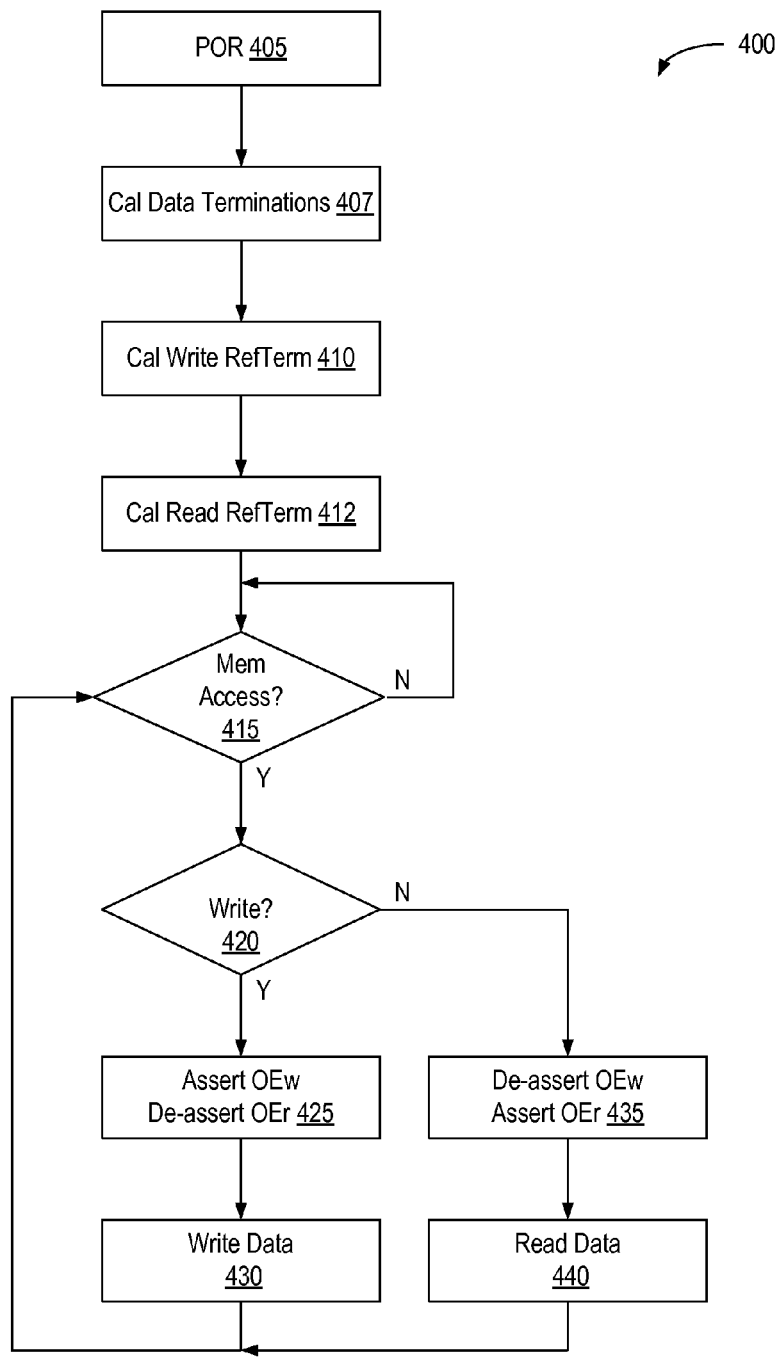
FIG. 4A is a flowchart 400 outlining the operation of system 200 of FIG. 2.

FIG. 4A is a flowchart 400 outlining the operation of system 200 of FIG. 2. The process begins at power-on reset (POR), the time at which system 200 is initialized (step 405). At step 407, termination elements Rt associated with the data channels may be calibrated to match the input impedances of receivers 220 to their respective data channels. Such calibration can take place once, or can be repeated periodically to accommodate supply-voltage and temperature variations that may affect the resistance values of termination elements Rt.

Next, at step 410, termination blocks RefTerm 230$m$ and 230$c$ are calibrated to optimize their impedances for writing data from controller IC 205 to memory IC 210. In one embodiment, the resistance and/or capacitive impedances though termination elements Z1, Z2, and Z3 are tuned to maximize the voltage and timing margins for data eyes at receivers 225 in IC 210. Methods and circuits for maximizing signal margins are well known to those of skill in the art, and are omitted here for brevity.

At step 412, termination blocks RefTerm 240$m$ and 240$c$ are calibrated to optimize their impedances for reading data from memory IC 210 to controller IC 205. In one embodiment, the resistance and/or capacitive impedances though termination elements Z1, Z3, and Z4 are tuned to maximize the voltage and timing margins for data eyes at receivers 225 in IC 205.

Once steps 410 and 412 are completed to calibrate the termination blocks for writes and reads, the system of FIG. 2 is prepared to support memory access (write and read) operations. Memory controller 205 generates access requests responsive for the memory IC 210 to instructions from a processor (not shown).

Returning to FIG. 4A, if the memory controller IC receives an instruction to access a memory IC (decision 415), the controller IC determines whether the access instruction is for a write (decision 420). If so, the controller IC enters a transmit mode and conveys a request to the memory IC to enter a receive mode. Requests from the controller to the memory IC take place over unidirectional or bidirectional request channels (not shown). Thus in their respective transmit and receive modes, and for the duration of their respective transmit and receive times, the controller IC and memory IC respectively assert and de-assert output-enable signals OEw and OEr (step 425) to set up the termination schemes for the data and reference channels as discussed above. Write data is then transmitted from the controller IC to the memory IC for storage. Once the write is complete, the controller and memory ICs leave their respective transmit and receive modes and the process returns to decision 415 to await another memory access request or to find a pending request.

If decision 420 determines that the requested access is not for a write, the controller IC assumes a read access in this simple example. The controller and memory ICs respectively de-assert and assert output-enable signals OEw and OEr (step 435) to set up the termination schemes for the data and reference channels as discussed above for the read direction. Read data is then transmitted to the controller IC from the memory IC. Once the read is complete, the process returns to decision 415 to await another memory access request or to find a pending request.

Figure 4B:
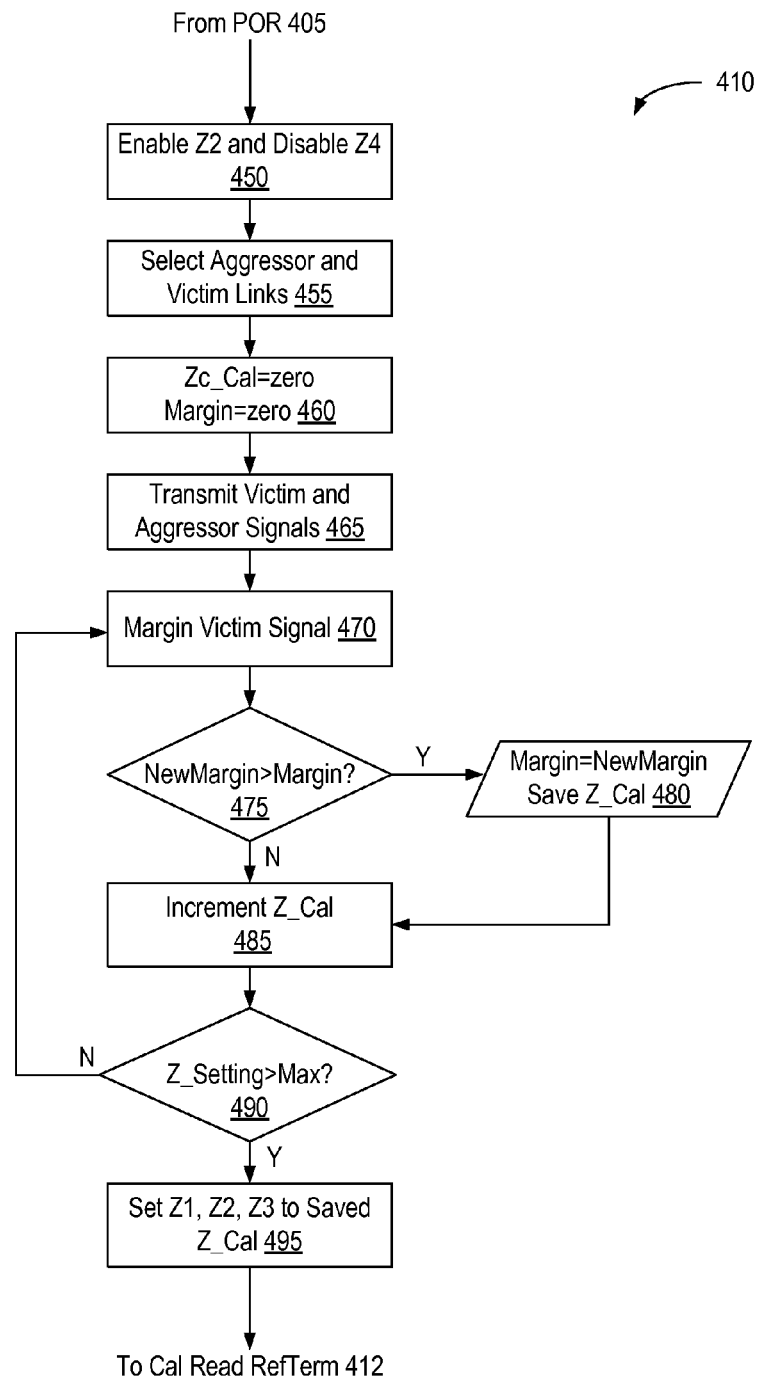
FIG. 4B is a flowchart depicting a calibration sequence that can be used for calibrate step 410 of FIG. 4A in accordance with one embodiment.

FIG. 4B is a flowchart depicting a calibration sequence that can be used for calibrate step 410 of FIG. 4A in accordance with one embodiment. Beginning with step 450 and recalling that this example pertains to the system of FIG. 2, termination element Z2 is enabled and element Z4 disabled (placed in its highest impedance setting). One of channels, e.g. DQ0(t), is then selected to be a victim channel and the others are selected to be aggressor channels. In this context, aggressor channels are those carrying signals that create the power supply noise which, in turn, deteriorates the victim channel performance.

The three termination element Z1, Z2, and Z3 used for proving the reference signal to IC 210 collectively support a finite number of termination settings. Assume, for example, that each termination element includes eight select terminals as depicted in FIG. 3. Such a system would produce $(8\times 3)^2 = 576$ unique termination settings, which can be expressed by calibration signal Zc_Cal, a combination of signal Zc_Cal and a portion of signal Zm_Cal in the example of FIG. 2. At step 460 signal Z_Cal is set to zero, the first setting. Also at step 460, the error margin ascribed to the victim link, though not yet measured, is initialized to zero. The margin can be a timing margin, a voltage margin, or a combination of the two.

The goal of the calibration sequence of FIG. 4B is to maximize the margin for the victim link in the presence of severe noise on the aggressor link or links, and to do so by selecting the best combination of values for termination elements Z1, Z2, and Z3 (represented collectively as a digital signal Zc_Cal). In step 465, a test pattern is conveyed on the victim channel while a noise-inducing aggressor signal is conveyed on the aggressor channel or channels. Supply and reference noise vary with the frequency of transmitted signals, and the aggressor signal or signals are selected to maximize noise. An ideal aggressor data pattern should excite the power supply noise at the power supply network (PDN) resonance frequency. The test pattern on the victim channel can be e.g. a pseudo-random bit stream. The test pattern and aggressor signal are maintained during the remaining steps of FIG. 4B.

In step 470, the error margin or margins of the test pattern on the victim channel is measured using any of a number of well-known margining techniques. If the new value NewMargin is greater than the stored value Margin (decision 475), then the new value is stored and the associated impedance setting Z_Cal saved (output 480). In any case, the impedance setting is incremented (step 480). Per decision 490, if the resulting Z_Cal is greater than the maximum Z_Cal setting, then the setting saved in output 480 is used to set the impedance values for termination element Z1, Z2, and Z3. If setting Z_Cal is not yet above the maximum value in decision 490, however, the process returns to step 470. The calibration sequence thus determines the combination of impedances that produce the largest margin for write operations.

The process of FIG. 4B tests the margin of the victim channel in the presence of aggressor noise for every possible combination of values for the active termination elements Z1, Z2, and Z3. The remaining termination element Z4 is not used in for write operations, and is thus inactive (e.g., set in its highest-impedance state). In other embodiments more or fewer termination elements can be similarly calibrated.

As shown in FIG. 4A, a read calibration step 412 follows the write calibration illustrated in FIG. 4B. Read calibration is like write calibration except that only termination element Z4 is calibrated: elements Z1 and Z3 are held to the values determined in step 410, and element Z2 is inactive. In other embodiments elements Z1 and Z3 can also be calibrated separately for read and write operations, or all four termination elements can be calibrated for maximum margin in the read direction.

Figure 5:
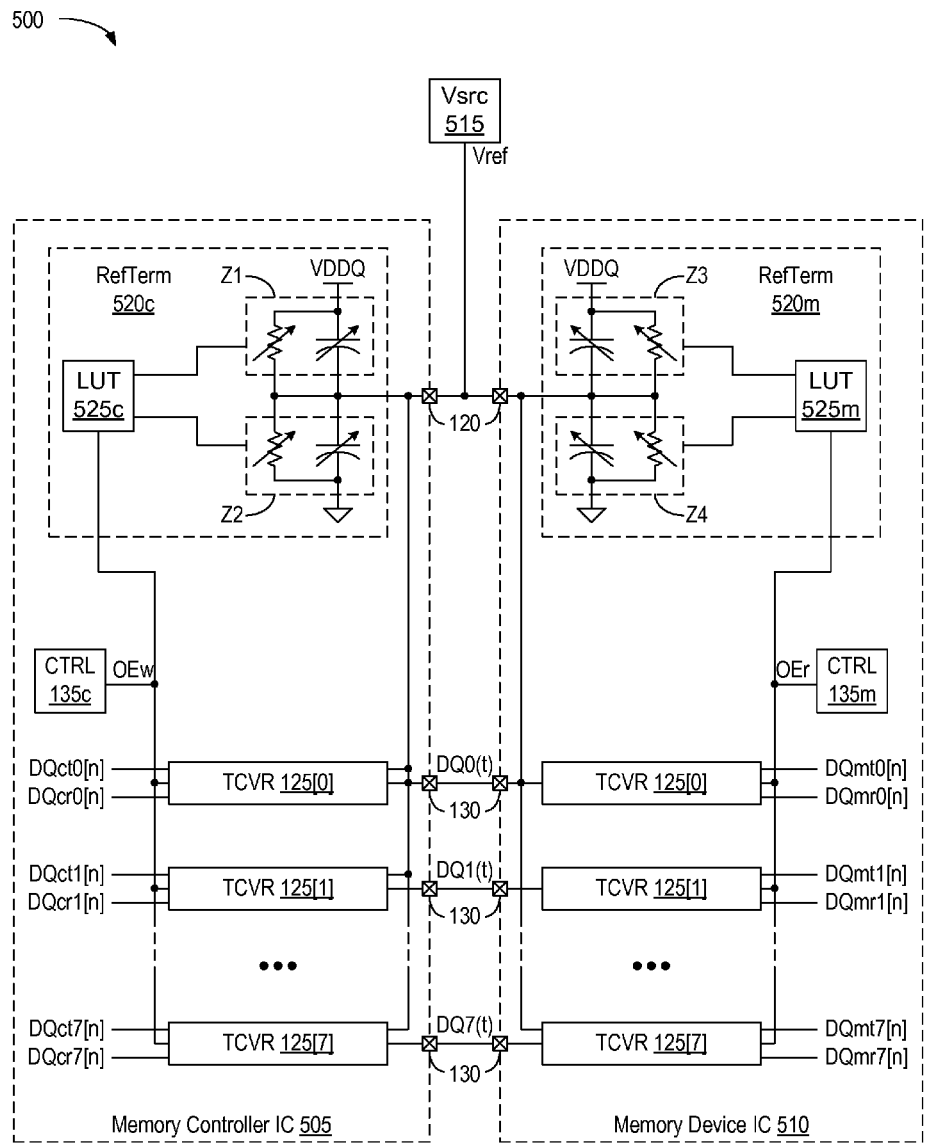
FIG. 5 depicts a system 500 in accordance with an embodiment in which respective ICs 505 and 510 are provided with a shared reference voltage Vref from a voltage reference 515 external to both ICs.

FIG. 5 depicts a system 500 in accordance with an embodiment in which respective ICs 505 and 510 are provided with a shared reference voltage Vref from a voltage reference 515 external to both ICs. Each IC includes a respective reference termination block 520c and 520m, which in turn include respective look-up tables (LUTs) 525c and 525m. System 500 is operationally similar to systems 100 and 200 detailed previously, with like-labeled elements being the same or similar. The values in LUTs 525c and 525m can be derived in the manner detailed above in connection with FIG. 4B.

In this example the externally provided reference voltage Vref is the same for both ICs. In practice, however, imbalances between the transceivers 125 on respective ICs 505 and 510 may degrade signaling performance if disregarded. For example, process, temperature, and supply-voltage variations between ICs 505 and 510 can result in slightly different DC voltage offsets between received signals and their local reference voltages. The resistance values for termination elements Z1-Z4 can be tuned to compensate for such local variations (dynamically, at-power up or otherwise on a one-time basis, or otherwise), and thus to provide reference voltages tailored to each receiving IC. The capacitances can also be adjusted to change the degree of decoupling provided on each end of the reference channel when conveying information between ICs 505 and 510 in either direction. LUTs 520c and 520m can be programmed to provide different values to their respective termination elements based on signal direction, and voltage reference 515 can likewise provide different reference voltages based on signal direction.

In the foregoing description and in the accompanying drawings, specific terminology and drawing symbols are set forth to provide a thorough understanding of the present invention. In some instances, the terminology and symbols may imply specific details that are not required to practice the invention. For example, circuits described or depicted as including metal oxide semiconductor (MOS) transistors may alternatively be implemented using bipolar technology or any other technology in which a signal-controlled current flow may be achieved. Moreover, while the channels depicted in FIGS. 1 and 2 are bidirectional, a bidirectional reference channel of the type described above can serve collections of unidirectional channels in which at least two convey signals in opposite directions. For example, command and request interfaces that extend between a memory controller and one or more memory device might be unidirectional but can nevertheless employ a shared bidirectional reference channel with a dedicated unidirectional read channel or bidirectional read/write channels.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, the point-to-point, chip-to-chip embodiments detailed previously are extensible to multi-drop buses, and to communication within and between larger or smaller systems. Furthermore, the advantages provided by the embodiments depicted above can be extended to other types of signals and signaling systems. Signaling schemes that can benefit from bidirectional reference schemes of the type detailed herein include near-ground signaling, where the receiver termination is terminated to ground instead of e.g. to supply node VDDQ, and Rambus Signaling Levels (RSL), to name but a few. In still other embodiments the transmitted signals can be multi-pulse-amplitude-modulated (multi-PAM) signals.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. An integrated circuit supporting a transmit mode and a receive mode, the integrated circuit comprising:
   at least one reference termination element connected to a reference pad to exhibit a transmit-reference signal on the reference pad in the transmit mode and a receive-reference signal different from the transmit-reference signal on the reference pad in the receive mode; and
   data transceivers, each data transceiver coupled to the reference pad and to a respective information pad, each transceiver to transmit a transmit-data signal in the transmit mode and to compare a respective receive-data signal with the receive-reference signal in the receive mode.

2. The integrated circuit of claim 1, further comprising control circuitry coupled to the reference termination element and the data transceivers to switch the reference termination element and the data transceivers between the transmit mode and the receive mode.

3. The integrated circuit of claim 1, wherein the at least one termination element includes a first termination element exhibiting a first termination impedance between the reference pad and a first DC node and a second termination element exhibiting a second termination impedance between the reference pad a second DC node.

4. The integrated circuit of claim 3, wherein a ratio of the first termination impedance to the second termination impedance differs between the transmit mode and the receive mode.

5. The integrated circuit of claim 1, wherein the reference termination element exhibits a transmit termination impedance in the transmit mode and a receive termination impedance in the receive mode, the reference termination element further including a calibration port to receive an impedance calibration signal to set at least one of the transmit termination impedance and the receive termination impedance.

6. The integrated circuit of claim 1, wherein the reference termination element includes at least one of an adjustable resistance or an adjustable capacitance.

7. A system comprising:
   a first integrated circuit having:
   a first reference pad to exhibit a transmit reference signal and a receive reference signal different from the transmit reference signal;
   first data pads, each first data pad to receive a receive data signal and to transmit a transmit data signal;
   receivers each coupled to the first reference pad and to a respective one of the first data pads, each receiver to compare the receive reference signal with the respective read data signal; and
   transmitters each coupled to a respective one of the first data pads, each transmitter to transmit a respective one of the transmit data signals; and
   a second integrated circuit having:
   a second reference pad coupled to the first reference pad to exhibit the transmit reference signal and the receive reference signal; and
   second data pads each coupled to one of the first data pads to communicate the respective receive data signal and the respective transmit data signal.

8. The system of claim 7, wherein the first integrated circuit is a memory controller and the second integrated circuit is a memory device, and wherein the transmit data signal is a write data signal and the receive data signal is a read data signal.

9. The system of claim 7, the first integrated circuit further comprising a reference termination element coupled to the first reference pad, the reference termination element exhibiting a transmit termination impedance to develop the transmit reference signal and a receive termination impedance to develop the receive reference signal.

10. The system of claim 9, the first integrated circuit further having a first reference termination element, coupled to the first reference pad, exhibiting a receive termination impedance to develop the receive reference signal and a transmit termination impedance to develop the transmit reference signal.

11. The system of claim 10, wherein the second integrated circuit further comprises a second reference termination element, coupled to the second reference pad, exhibiting a third termination impedance to develop the transmit reference signal and a fourth termination impedance to develop the receive termination impedance.

12. The system of claim 9, further comprising control circuitry coupled to the reference termination element to switch the reference termination element between a transmit mode and a receive mode.

13. The system of claim 9, wherein the reference termination element includes a first termination element exhibiting a first termination impedance between the first reference pad and a first DC node and a second termination element exhibiting a second termination impedance between the first reference pad a second DC node.

14. The system of claim 13, wherein a ratio of the first termination impedance to the second termination impedance differs between a transmit mode and a receive mode.

15. A method of terminating a reference channel extending between a first circuit and a second circuit, the method comprising:
   selecting a first termination impedance for the reference channel to develop a first reference signal on the reference channel;

transmitting first information signals from the first circuit to the second circuit over an information channel;

comparing the first information signals with the first reference signal to recover first information;

selecting a second termination impedance for the reference channel to develop a second reference signal different from the first reference signal on the reference channel;

transmitting second information signals from the second circuit to the first circuit over the information channel; and comparing the second information signals with the second reference signal to recover second information.

16. The method of claim 15, further comprising transmitting third information signals from the first circuit to the second circuit over a second information channel and comparing the third information signals with the first reference signal to recover the third information.

17. The method of claim 16, further comprising transmitting fourth information signals from the second circuit to the first circuit over the second information channel and comparing the fourth information signals with the second reference signal to recover the fourth information.

18. The method of claim 15, wherein selecting the first termination impedance comprises calibrating reference termination impedances on both ends of the reference channel.

19. The method of claim 18, wherein selecting the second termination impedance comprises calibrating the reference termination impedances on both ends of the reference channel.

20. The method of claim 15, wherein each of the first circuit and the second circuit are integrated-circuit devices.

* * * * *